United States Patent [19]

Swenson

[11] Patent Number: 4,479,862
[45] Date of Patent: Oct. 30, 1984

[54] SPUTTERING

[75] Inventor: James W. Swenson, Minneapolis, Minn.

[73] Assignee: Vertimag Systems Corporation, Minneapolis, Minn.

[21] Appl. No.: 569,141

[22] Filed: Jan. 9, 1984

[51] Int. Cl.³ ............................................. C23C 15/00
[52] U.S. Cl. ............................. 204/192 R; 204/192 C; 204/298
[58] Field of Search ................. 204/192 R, 192 C, 298

[56] References Cited

U.S. PATENT DOCUMENTS 4,341,816  7/1982  Lauterbach et al. ........... 204/192 C

OTHER PUBLICATIONS

Van Esdonk et al., Research/Development Jan. 1975, pp. 41–44.

Primary Examiner—Arthur P. Demers
Attorney, Agent, or Firm—Jacobs & Jacobs

[57] ABSTRACT

A layer of urethane or silicone elastomer is interposed between a plastic film undergoing sputter deposition and a support for the film to avoid thermal damage to the film.

25 Claims, 4 Drawing Figures

SPUTTERING

The present invention is directed to improvements in sputtering, and more particularly to improvements in sputter plating a thin plastic film with a thin layer of a metal, metal oxide, metal alloy or other depository material.

Sputtering is an old and well-known vacuum deposition technique, and dates back at least as far as 1852. To carry out a typical sputtering process, an anode, cathode and the substrate to be coated are placed in a chamber which is subsequently evacuated. An ionizable gas, typically a gas such as argon, is pumped into the chamber and an electrical discharge is imposed between the anode and cathode, thereby causing an electrical discharge plasma to be created. The cathode is composed of the depository material to be deposited on the substrate, such as a metal, metal oxide, metal alloy, silica and the like, and this cathode target is subjected to bombardment by positive ions. The particles lost from the cathode during its disintegration by the ion beam are deposited on the surface of the substrate to be plated. Typical absolute pressures employed a range from as high as about 150 Torr to as low as about $10^{-6}$ Torr; generally sputtering is carried out at a pressure from about $10^{-1}$ to about $10^{-3}$ Torr. While argon is the preferred gas in terms of cost availability, other gases can be employed, such as the other noble gases, hydrogen, nitrogen or mixtures thereof. See Penning U.S. Pat. No. 2,146,025 and Kay U.S. Pat. No. 3,282,816, which are incorporated herein by reference thereto. An effective means of carrying out the sputtering process is through the use of a commercially available planar magnetron cathode assembly, which employs a magnetic field to confine the electron discharge to the cathode region. See King U.S. Pat. No. 3,472,751, Corbani U.S. Pat. No. 3,878,085 and McLeod U.S. Pat. No. 3,956,093, which are incorporated herein by reference thereto.

The present invention uses the sputtering deposition process to deposit a thin layer of depository material, such as metal, metal alloy, etc., on a plastic film, particularly a polyester film, such as polyethylene terephthalate. In practice, the plastic film is heated by the deposited material and hence means must be provided to remove the heat to prevent thermal damage to the plastic film.

Various proposals have been made in the sputtering art for temperature control of the abstract to be coated, but these are not applicable to sputter deposition of a material onto a plastic film. For example, Glick et al. U.S. Pat. No. 3,764,511 discusses the use of a metal pedestal as a heat sink on which the substrate to be coated is placed, with possible internal cooling. Glick et al. also described the use of vacuum grease at the substrate/sink interface. Neither is satisfactory for the purposes of the present invention.

If a metal support is used as a thermal sink, the surface of the metal must be in good contact with the plastic film over the entire area of contact, since even small gaps between the plastic film and the surface of the metal sink will create hot spots in the plastic film resulting in damage to the film during sputtering. It is difficult to avoid such gaps between the metal sink and the uncoated plastic film, and even more difficult after the film has been coated and hence becomes stiffer and less compliant.

Thermally conductive greases at the substrate/sink interface do reduce thermal damage to the film, but they leave undesired permanent residues on the film, and on the sputter-coating thereon when the coated film is placed coated-side down on the metal sink for coating of the reverse side.

It has now been discovered that a layer of urethane elastomer or silicone elastomer interposed between the plastic film/sink interface permits the use of higher sputtering rates without thermal damage to the plastic film during the sputter deposition. Quite unexpectedly, it has been found that urethane and silicone elastomers "cling" both to the plastic film and to the metal-deposited plastic film, thereby eliminating the gaps between the plastic film or the metal-deposited plastic film and the sink that are otherwise formed during the sputtering. Furthermore, these elastomers do not leave any undesired permanent residue on the plastic film or on the coated layer thereon. Any residue that does form is readily removed by exposure to the glow discharge in the sputtering chamber.

The theoretical basis for the "cling" of the plastic film and of the coated film to the urethane or silicone elastomer is not presently understood. However, regardless of the theoretical basis for the clinging effect, the use of the specified elastomers at the plastic film/sink and the coated film/sink interface permits the sputtering rates to be greatly increased without thermal damage to the plastic film because excess heat can be rapidly transferred away from the film through the elastomer layer.

Preferably, the plastic film is a polyester, such as a polyethylene terephthalate, but other plastic films, such as polyvinylidene chloride, can be used.

The elastomers may be any urethane or silicone elastomer. While it is preferred to use an elastomer filled with a metal filler, such as copper, to increase its thermal conductivity, unfilled elastomers can also be used, because the unfilled elastomers will eliminate the formation of gaps and will hence permit the use of higher sputtering rates. Most preferably, the elastomer is a thermally conductive silicone elastomer, which may be an elastomeric silicone or siloxane. Presently preferred are the thermally conductive RTV silicone elastomers, such as "Eccosil" 4854, 4052 or 4995 manufactured by Emerson and Cuming. RTV silicone elastomers are generally siloxanes, as described in Bruner U.S. Pat. Nos. 3,035,016 and 3,077,465.

Useful urethane elastomers include the room temperature curing urethanes, particularly those that can be formulated as a liquid for pouring or casting since the use of casting techniques facilitate formation of the elastomer layer. However, the urethane elastomer layer can also be formed by calendering or extrusion, or by injection-, blow-, transfer-, or compression-molding. Flexible urethane elastomers are preferred.

The urethane or silicone elastomer is generally used as a layer of from about 0.5 to about 20 mm, preferably from about 1 to about 5 mm, thick, supported on the surface of the sink, usually a metal sink, but the thickness of the elastomer layer may be greater than 20 mm or smaller than 0.5 mm, if desired.

A convenient way to prepare the sink for use is to degas the elastomer polymerizate comprising the monomer(s) and curing agent, such as by subjecting the polymerizate to a pressure of $10^{-6}$ Torr for about 10 to about 30 minutes, and pouring the degassed polymerizate onto a sandblasted or otherwise cleaned surface of a metal plate, e.g. an aluminum plate, at ambient conditions. A flat layer of desired thickness is obtained by pressing the polymerizate against the metal plate with a polycarbonate plate and permitting excess material to be extruded beyond the metal plate. After curing of the elastomer, at ambient or elevated temperature, if desired, the polycarbonate plate is removed, leaving a smooth, flat layer of elastomer adhered to the metal plate. The plastic film is then laid down on the elastomer, taking care to prevent air bubbles from forming under the film. If desired, the elastomer may be degassed before and/or after laying down the plastic film.

While the present invention is usefully employed to coat a metal, metal oxide or metal alloy on the plastic film, any depository material that is used in a sputtering process may be sputtered according to the present invention onto the thus supported plastic film using conventional sputtering equipment and procedures. For example, the present invention can be used to advantage to sputter deposit a metal, metal oxide or metal alloy on the plastic film to form a magnetic recording medium.

The present invention is illustrated in terms of a preferred embodiment in the accompanying drawing in which.

Figure 1:
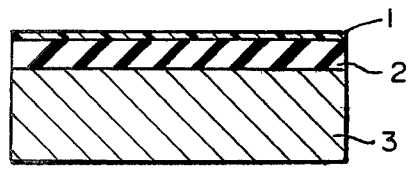
FIG. 1 is an elevational view, in section, on an enlarged scale, of a plastic film supported in accordance with the present invention.

FIG. 1 shows a plastic film 1 tightly and uniformly clinging to a layer 2 of a urethane or silicone elastomer, which is in turn adhered to a metal plate 3, such as an aluminum plate. The metal plate 3 may be of any desired shape and is shown for convenience in FIG. 1 as a square. Plastic film 1, preferably a polyester film, clings to elastomer layer 2 without any air bubbles between the film 1 and layer 2.

Figure 2:
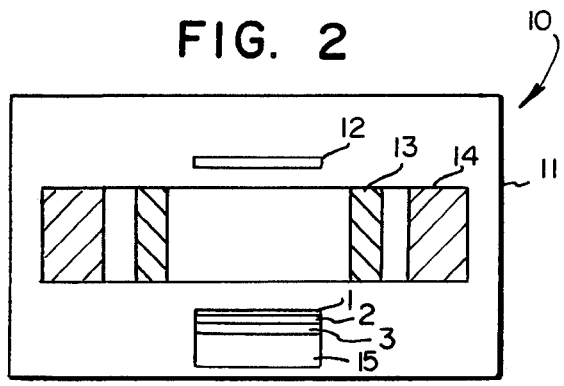
FIG. 2 is a highly diagrammatic view of a sputtering apparatus according to the present invention.

FIG. 2 is a highly diagrammatic view of a planar magnetron 10 useful in sputter deposition of a metal or metal alloy onto a plastic film. Magnetron 10 may be as described in the aforementioned Corbani U.S. Pat. No. 3,878,085, the disclosure of which is incorporated herein by reference thereto. Magnetron 10 includes as its essential components, a chamber 11, an anode 12, cylindrical cathode 13 composed of the material to be deposited, cylindrical magnet 14 and substrate support 15. Magnet 14 acts to confine the charged particles of depository material to the cathode region. Each of the anode 12, cathode 13, magnet 14 and substrate support 15 are suitably supported in chamber 11 by means not shown.

As shown in FIG. 2, the assembly of plastic film 1, elastomeric layer 2 and metal plate 3 is placed on the substrate support 15, with the exposed surface of the film 2 facing anode 12 and cathode 13. Magnetron 10 is operated in a conventional manner by evacuating the device to an absolute pressure of about $10^{-6}$ Torr and then pumping an ionizable gas, such as argon, into chamber 10. An electrical discharge is established between anode 12 and cathode 13, causing an electrical plasma to be created. Particles of depository material will be released by the erosion of the cathode 13 and will be deposited on the exposed surface of the plastic film 1. When the desired thickness of the sputter-coated material deposited on the plastic film 1 is reached, the sputtering is discontinued. The coated film 1 may then be turned over to coat the other side.

While a ring-shaped cathode 13 and ring-shaped magnet 14 are shown in FIG. 2, it is to be understood that the sputtering device 10 per se does not form a part of the invention, and any configuration of anode, cathode and magnet is suitable, such as the linear configuration of FIGS. 5 and 6 of Corbani, U.S. Pat. No. 3,878,085.

Comparative data have been obtained using a cathode made of a CoCr alloy and a polyethylene terephthate ("Mylar") film of about 2 to 3 mils thick. Sputtering was effected with and without the use of the elastomer layer between the film and the aluminum plate. Without the elastomeric film, when the sputtering rate exceeded 1,000 Å/min., the plastic film was damaged due to excessive heat buildup during sputtering. When a layer of ECCOSIL 4952 RTV Silicone elastomer of about 3 mm was interposed between the film and the aluminum substrate, as shown in FIG. 1, a sputtering rate as high as 14,000 Å/min. at target power of 15,500 watts was successfully employed without damage to the film. This was higher than the rated power supply of 10,000 watts of the apparatus being employed, which was a Materials Research Corp., Model 903. The use of a 4 mm thick layer of a "Devon Flexane" 80 urethane elastomer enabled the use of a sputtering rate of about 6000 Å/min. without damage to the film.

In another experiment, Dow Corning 3110 RTV silicone elastomer was used as the elastomeric layer. This silicone elastomer does not contain a thermally conductive metal filler. Sputtering rates of 5000–6000 Å/min. at 8000 watts were obtained with this unloaded silicone elastomer.

Figure 3:
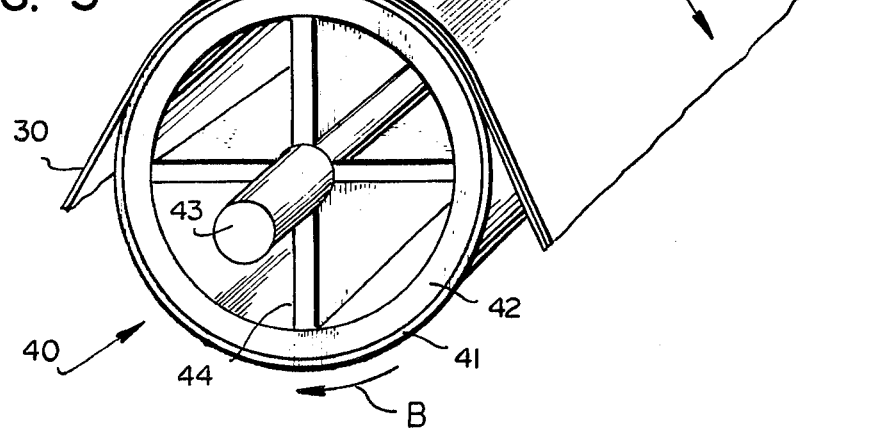
FIG. 3 is a diagrammatic view, in perspective, of another embodiment of the invention.

Referring to FIG. 3, plastic film 30 is sputter-coated by feeding the film 30 from a supply roll (not shown) over the surface of a rotating drum 40 in the direction shown by arrow A and thence to a takeup roll (not shown). Drum 40 is supported for rotation about arrow B in a sputtering chamber, such as chamber 10 of FIG. 2, and the charged particles of depository material are directed towards the exposed surface of film 30, as shown by arrow C. Mask 50 confines the deposited material to the narrow strip 31, and in this manner a coating 32 is deposited over the extent of film 30. At all times during the sputtering, strip 31 is in intimate contact with a layer 41 of urethane or silicone elastomer of the same type as used to form layer 1 in FIG. 1. Elastomer layer 41 is carried by a cylindrical shell 42 of the drum 40. Drum 40 rotates about axle 43, which is connected via splines 44 to cylindrical shell 42.

Figure 4:
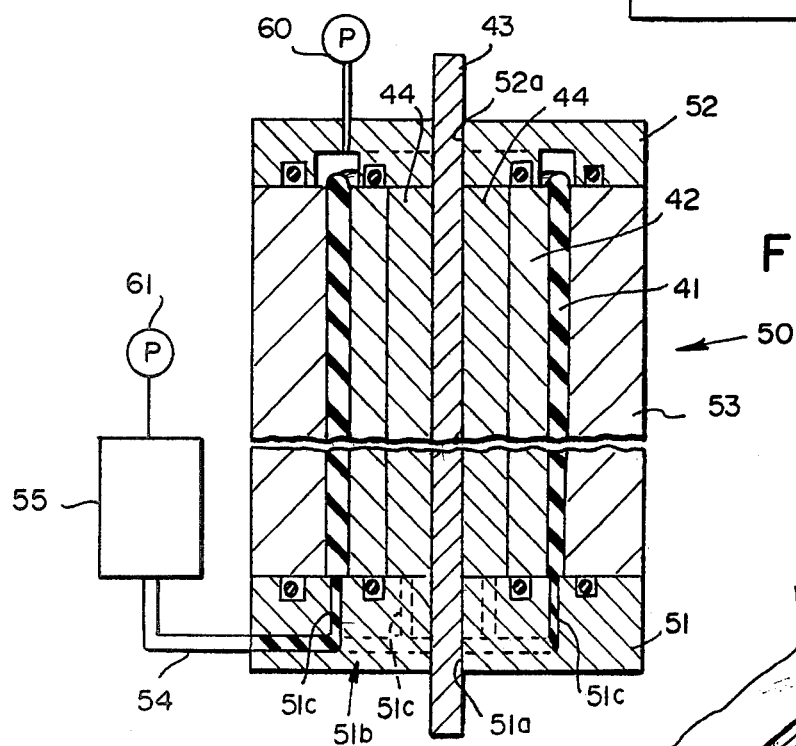
FIG. 4 is a diagrammatic view, in section, of apparatus used to prepare the embodiment shown in FIG. 3.

Drum 40 is coated with layer 41 by any suitable means, such as shown in FIG. 4. Thus, drum 40 is located in mold 50 with the axle 43 fitted within apertures 51a, 52a in end caps 51 and 52, respectively, and with cylindrical shell 53 spaced from the cylindrical shell 42 of drum 40. End caps 51 and 52 are fastened to shell 53 by fasteners (not shown) after the mold is assembled. O-rings in end caps 51 and 52 form a liquid seal on both sides of the annulus formed between shells 42 and 53, and a vacuum pump 60 is in fluid communication with this annulus. Manifold 51b is connected via conduit 54 to tank 55, which is in turn connected to pump 61. Manifold 51b has risers 51c that terminate at the entrance to the annulus between shells 42 and 53.

To form elastomer layer 41, a polymerizate of the desired elastomer is placed in tank 55, and vacuum pump 60 is turned on to draw a vacuum, e.g. about $10^{-1}$ to about $10^{-2}$ Torr, in the annulus between shells 42, 53 and in manifold 51b, risers 51c and conduit 54. Pump 61 is then energized to pump air, nitrogen or other gas into tank 55 at a pressure of about 40 psig whereby the polymerizate is pumped through conduit 54, manifold 51b and risers 51c into the annulus between shells 42, 53. The vacuum in the system degasses the polymerizate as it is being pumped. Conveniently, end cap 52 is of polycarbonate or other transparent plastic so that pumps 60 and 61 can be turned off when the polymerizate is seen to have been pumped to slight excess, as shown in FIG. 4. After curing, the mold 50 is disassembled and any flash is trimmed away from drum 40.

In addition to its use during a sputter deposition process, the present invention also has utility to support the plastic film during other vacuum deposition techniques, e.g. during vacuum evaporation of a metal onto the plastic film. The present invention may also be used to support the plastic film during treatment of the plastic film with a corona glow discharge or other ion treatment by which the plastic film is cleaned or pretreated, e.g. as a pretreatment to allow the film to be printed upon or to accept ion exchange groups attached thereto via graft copolymerization. In its broadest aspects, the present invention is thus suitable for use in supporting the plastic film during any operation wherein it is desired to prevent thermal damage to the film.

I claim:

1. In a method of sputter deposition of a depository material from a cathode to a target material supported on a target substrate, the improvement which comprises sputter depositing said depository material from said cathode onto a plastic film, which is supported during said sputter deposition by a layer of a urethane or silicone elastomer, which is in turn supported by said target substrate.

2. The method according to claim 1, wherein said plastic film is a polyester film or a polyvinylidine chloride film.

3. The method according to claim 1, wherein said elastomer is a urethane elastomer.

4. The method according to claim 1, wherein said elastomer is a silicone elastomer.

5. The method according to claim 4, wherein said silicone elastomer is an RTV silicone elastomer.

6. The method according to claim 5, wherein said silicone elastomer is filled with a metal filler.

7. The method according to claim 6, wherein said metal is copper.

8. The method of claim 1, wherein said depository material is a metal, metal oxide, metal alloy or silica.

9. The method of claim 1, in which said plastic film is moved relative to said cathode during said sputtering deposition, whereby depository material is continuously deposited on said moving film, and said plastic film is continuously supported during sputter deposition at least in the area of said plastic film where depository material is being sputter deposited.

10. The method according to claim 1, wherein said plastic film is a polyester film and said elastomer is an RTV silicone elastomer.

11. The method according to claim 12, wherein said silicone elastomer is filled with a metal filler.

12. A cathode target for a sputter deposition apparatus, which comprises a support, a layer of a urethane or silicone elastomer having one surface thereof in contact with and supported by said support and a plastic film in intimate contact with the other surface of said layer of elastomer.

13. The apparatus according to claim 12, wherein said plastic film is a polyester film or a polyvinylidine chloride film.

14. The apparatus according to claim 12, wherein said elastomer is a urethane elastomer.

15. The apparatus according to claim 12, wherein said elastomer is a silicone elastomer.

16. The apparatus according to claim 15, wherein said silicone elastomer is an RTV silicone elastomer.

17. The apparatus according to claim 16, wherein said silicone elastomer is filled with a metal filler.

18. The apparatus according to claim 17, wherein said metal is copper.

19. The apparatus according to claim 12, wherein said plastic film is a polyester film and said elastomer is an RTV silicone elastomer.

20. The apparatus according to claim 19, wherein said silicone elastomer is filled with a metal filler.

21. The apparatus according to claim 12, wherein said support comprises an aluminum plate.

22. The apparatus according to claim 20, wherein said support comprises an aluminum plate.

23. The apparatus according to claim 12, wherein said support comprises cylindrical metal wall means, and said elastomer layer is supported on the outer surface of said wall means.

24. The apparatus according to claim 23, wherein said support means is a rotatable drum means carrying said cylindrical metal wall means.

25. In a method of treatment of a plastic film during which the film is subject to thermal damage, the improvement which comprises supporting said plastic film during said treatment upon a layer of a urethane or silicone elastomer, which is itself carried by a support means.

* * * * *